United States Patent [19]

Savage, Jr.

[11] Patent Number: 4,471,414
[45] Date of Patent: Sep. 11, 1984

[54] INTEGRATED LIGHT UNIT AND CIRCUIT ELEMENT ATTACHABLE TO CIRCUIT BOARD

[76] Inventor: John M. Savage, Jr., 8118 W. 83rd St., Apt. C, Playa del Rey, Calif. 90291

[21] Appl. No.: 357,063

[22] Filed: Mar. 11, 1982

[51] Int. Cl.³ .............................................. H01R 33/00
[52] U.S. Cl. ...................................... 362/226; 362/311; 362/353; 362/355; 362/363; 362/375; 362/455; 362/800
[58] Field of Search ............... 362/226, 311, 353, 355, 362/363, 375, 455, 800

[56] References Cited

U.S. PATENT DOCUMENTS

| | | | |
|---|---|---|---|
| 935,608 | 11/1906 | Gilman . | |
| 2,599,361 | 6/1952 | Beal | 173/328 |
| 2,847,559 | 8/1958 | Harrington et al. | 240/2 |
| 2,946,994 | 7/1960 | Dumke et al. | 340/381 |
| 2,957,072 | 10/1960 | Rigel | 240/2 |
| 3,115,308 | 12/1963 | Stark | 240/8.16 |
| 3,207,954 | 9/1965 | Elliott | 317/99 |
| 3,229,083 | 1/1966 | George, Jr. | 240/8.16 |
| 3,285,548 | 11/1966 | Matto et al. | 248/27 |
| 3,286,255 | 11/1966 | Sanchez | 340/387 |
| 3,396,269 | 8/1968 | Sorenson | 240/152 |
| 3,435,449 | 3/1969 | Sloan | 340/381 |
| 3,473,015 | 10/1969 | Haas et al. | 240/46.59 |
| 3,604,918 | 9/1971 | Cook | 240/8.16 |
| 3,611,360 | 10/1971 | Bailey | 240/52.1 |
| 3,659,093 | 4/1972 | Rieth | 240/152 |
| 3,774,021 | 11/1973 | Johnson | 240/2.1 |
| 3,777,137 | 12/1973 | Costanzo et al. | 240/52 R |
| 3,805,347 | 4/1974 | Collins | 29/25.13 |
| 3,818,486 | 6/1974 | Bailey | 340/381 |
| 3,887,803 | 6/1975 | Savage | 240/151 |
| 3,982,122 | 9/1976 | Bull et al. | 240/152 |
| 4,035,681 | 7/1977 | Savage | 313/110 |

FOREIGN PATENT DOCUMENTS

| | | |
|---|---|---|
| 1360727 | 4/1964 | France . |
| 2126650 | 6/1972 | France . |
| 1043359 | 9/1966 | United Kingdom . |

Primary Examiner—Stephen J. Lechert, Jr.
Attorney, Agent, or Firm—William W. Haefliger

[57] ABSTRACT

A light assembly including a light unit having a base and terminal means projecting rearwardly from the base, incorporates:

(a) a body and a retainer thereon defining a forwardly opening recess to receive the base of the light unit for retention in the recess, (b) the body defining multiple cavities having ends located between the recess and a rear outer wall defined by the body, for reception of the light unit terminal means and for reception of auxiliary terminal means projecting rearwardly of the body.

26 Claims, 19 Drawing Figures

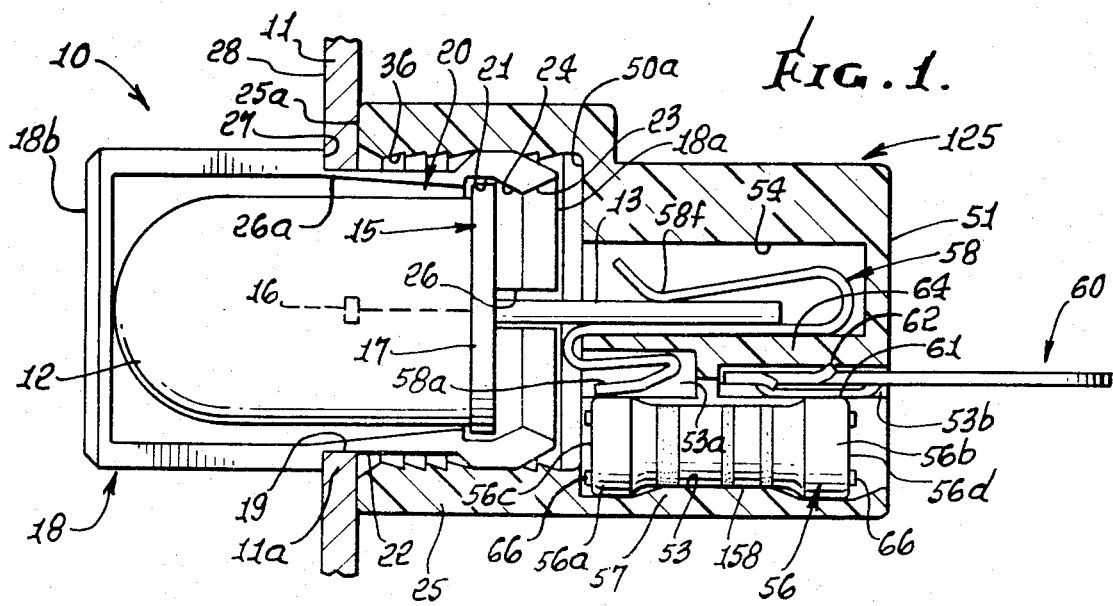

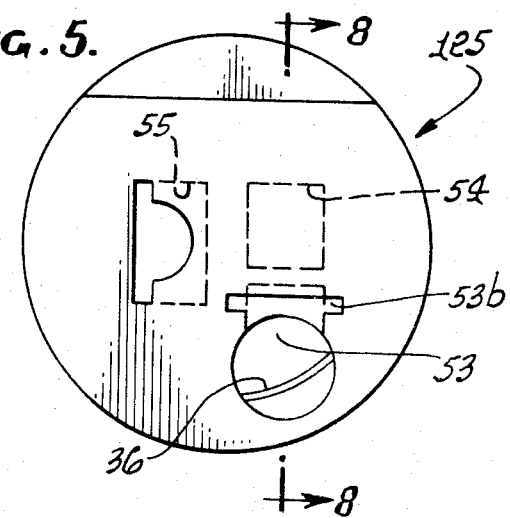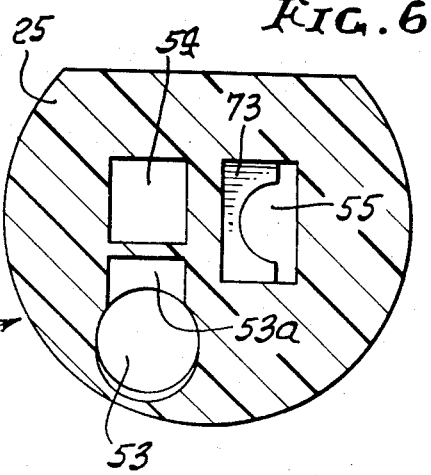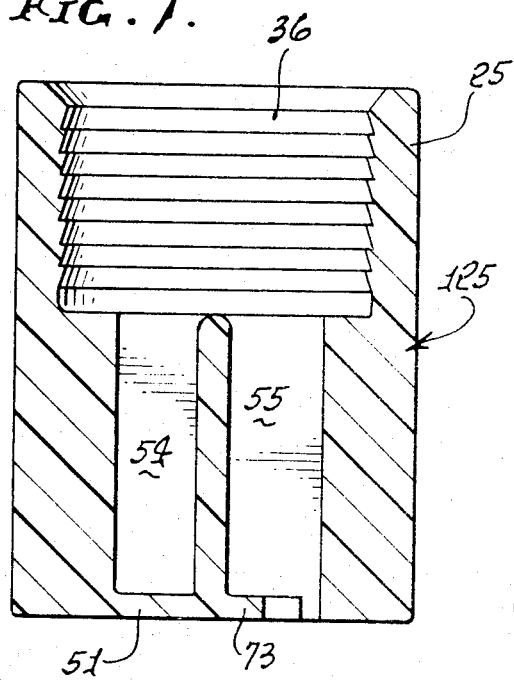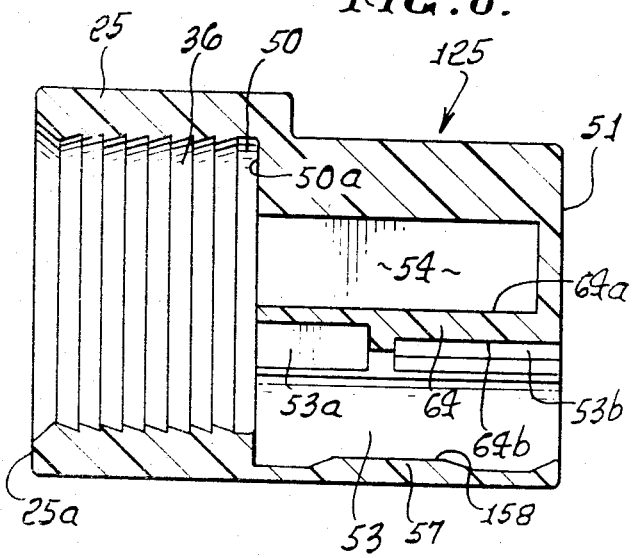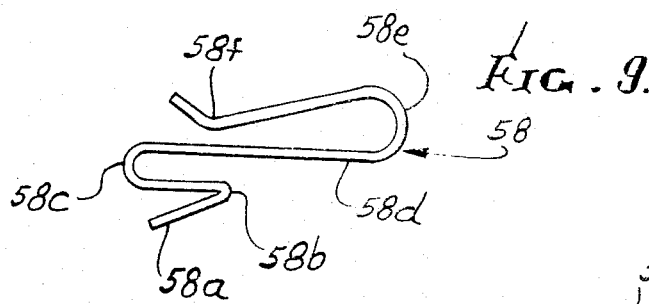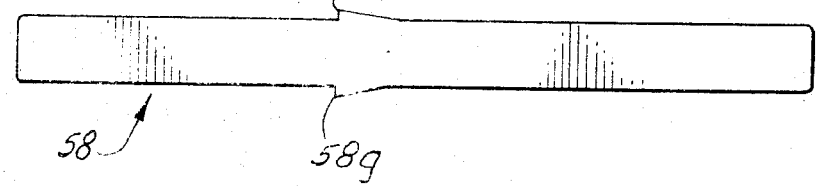

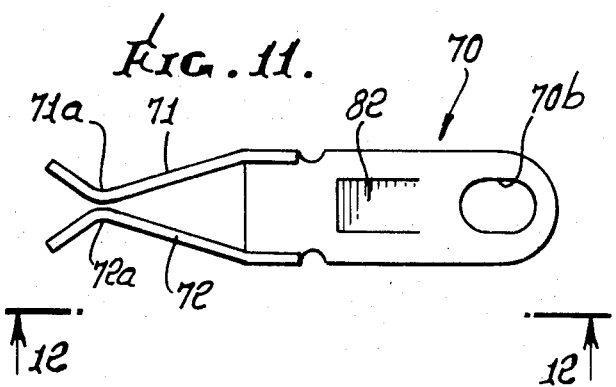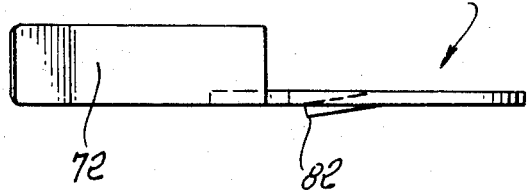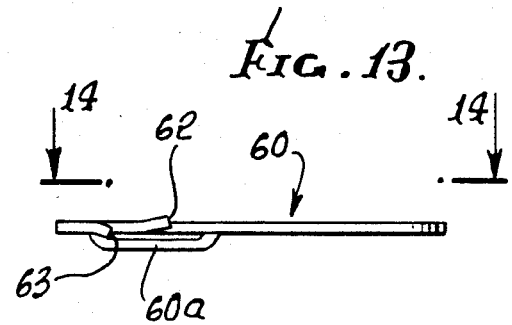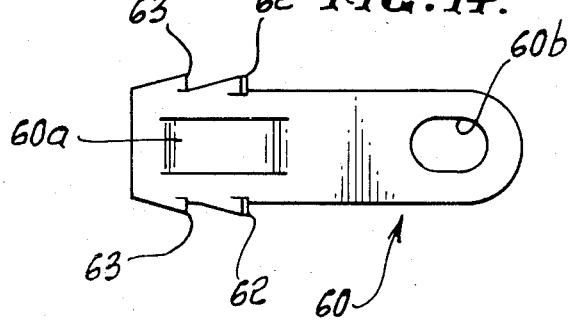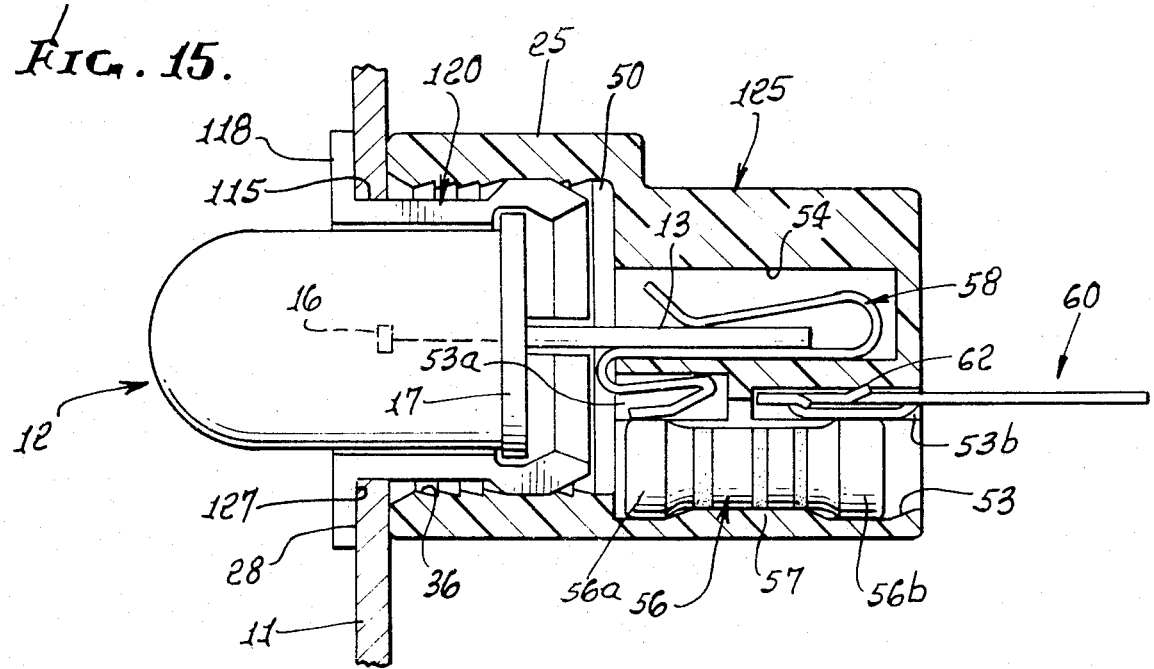

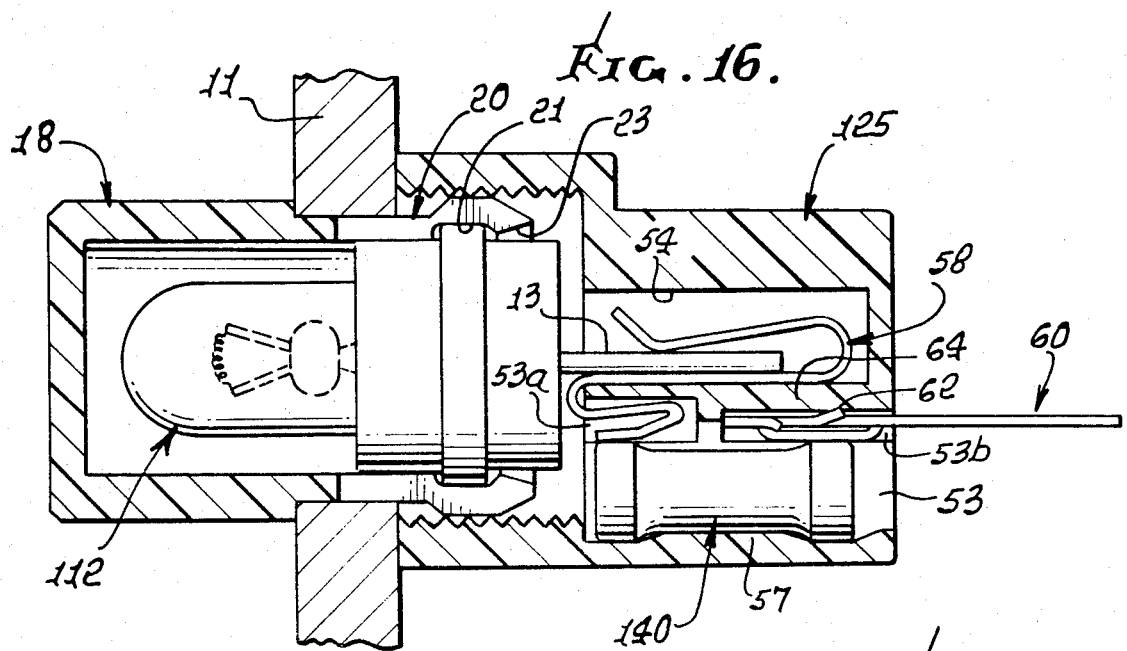
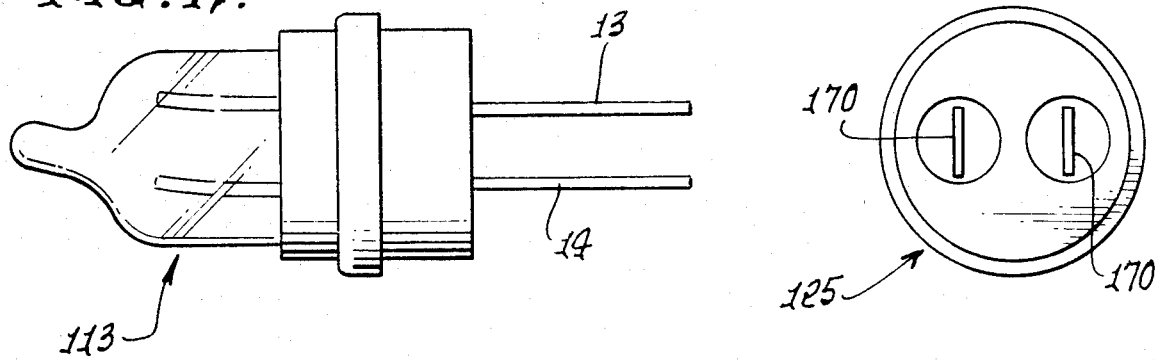
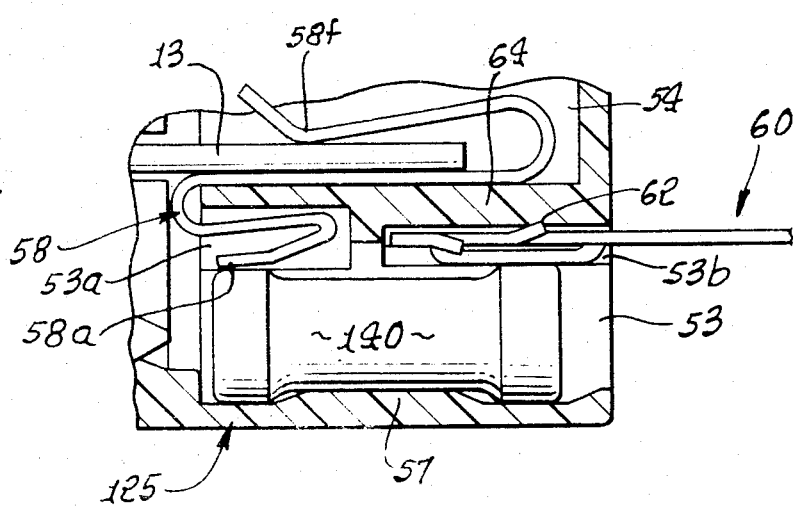

INTEGRATED LIGHT UNIT AND CIRCUIT ELEMENT ATTACHABLE TO CIRCUIT BOARD

BACKGROUND OF THE INVENTION

This invention relates generally to the integration of circuit elements and/or auxiliary terminals to light units having primary terminals; and more particularly concerns a method and means of providing such integration in a structure which mounts the light unit to a panel or circuit board. While the invention will be primarily described in relation to a light unit in the form of a light emitting diode, or LED, it will be understood that other forms of light units, as for example incandescent lamps, and neon lamps, may be used.

In my U.S. Pat. No. 4,195,330, there is described a means for quickly mounting a light unit such as an LED for example, to a panel, with unusual advantage. There is presently a need for integrating a circuit element or elements to such a light unit and mount therefor, such elements typically comprising resistors. While it is known to remotely electrically connect circuit elements with light units such as LEDs, such prior connections are bulky; they impose weight on the LED leads; they require unwanted assembly steps including soldering of the elements to wires projecting from the LEDs; and they suffer from other disadvantages. To my knowledge, no way was known, prior to the present invention, to integrate a circuit element or elements with light units by the unusually advantageous means described herein, to provide the surprisingly advantageous results now achievable.

SUMMARY OF THE INVENTION

It is a major object of the invention to provide the above referred to integration of circuit elements with panel mountable light units, with attendant advantages including ease and rapidity of assembly; low bulk and small overall size, elimination of need for soldering connections; and no weight imposition in LED leads by circuit elements connected to such leads. Basically, the invention is adapted for use in a light assembly including a light unit having a base and terminal means (as for example two terminals or leads) projecting rearwardly from the base. In this environment there is provided:

(a) a body and retainer thereon defining a forwardly opening recess to receive the base of the light unit for retention in the recess, (b) the body defining multiple cavities having ends located between said recess and a rear outer wall defined by the body, for reception of said light unit terminal means and for reception of auxiliary terminal means projecting rearwardly of the body.

Typically, the retainer may be integral with the body and have an annular portion extending about the body recess, the annular portion having a serrated base for retention of clip structure which in turn is coupled to the base of the light unit; the circuit element (as for example a resistor) is typically locatable in one of the body cavities for electrical connection with the light unit terminal means and also with the auxiliary terminal means; and an electrical connector is typically located in at least two of the cavities for engaging the circuit element and a light unit terminal, with a body wall projecting between those two cavities to stabilize the connector so that it does not require soldering to the circuit element or to the light unit terminal. Also, the connector and auxiliary terminal preferably engage the side of the resistor element, so that coding indicia on the end or ends of the resistor may be viewed after assembly of the resistor into the body. Thus, it will be seen that the same body mounts or carries the light unit, the clip structure in the recess, the circuit element and the connector in body cavities, and the auxiliary terminal means, all in close together, integrated relation.

Additional objects include the provision of light units in such forms as LEDs, incandescent lamps and neon lamps; the provision for a circuit element in the form of a jumper strip; and the provision for two auxiliary terminals directly connected to light unit terminals in body cavities.

These and other objects and advantages of the invention, as well as the details of an illustrative embodiment, will be more fully understood from the following specification and drawings, in which:

DRAWING DESCRIPTION

FIG. 1 is a sectional elevation taken through a light emitting diode assembly incorporating a holder for an electrical circuit element, and clip means;

FIG. 2 is another sectional elevation taken through the FIG. 1 device;

FIG. 3 is an external elevational view of the holder body;

FIG. 4 is an end view taken on lines 4—4 of FIG. 3;

FIG. 5 is an end view taken on lines 5—5 of FIG. 3;

FIG. 6 is a section taken on lines 6—6 of FIG. 3;

FIG. 7 is a section taken on lines 7—7 of FIG. 4;

FIG. 8 is a section taken on lines 8—8 of FIG. 5;

FIG. 9 is an elevational view of the clip means appearing in FIG. 1;

FIG. 10 is a top plan view of the FIG. 9 clip means;

FIG. 11 is a top elevational view of the clip means appearing in FIG. 2;

FIG. 12 is a side plan view of the clip means seen in FIG. 11;

FIG. 13 is a side elevational view of a terminal as shown in FIG. 1;

FIG. 14 is a top plan view of the terminal seen in FIG. 13;

FIG. 15 is a view like FIG. 1, but showing a modified structure receiving the light emitting diode;

FIG. 16 is a view like FIG. 1; but showing use of an incandescent bulb;

FIG. 17 is an elevation showing a neon bulb usable with the FIG. 1 holder;

FIG. 18 is an end view of a modified assembly;

FIG. 19 is a fragmentary view like FIG. 1, but showing a further modified assembly.

DETAILED DESCRIPTION The light emitting assembly 10 seen in FIGS. 1 and 2 is attached to panel 11. The LED 12 (or other light unit such as an incandescent lamp or neon lamp) includes terminals 13 and 14 projecting rearwardly from housing 15, and also within the latter. A luminous chip 16 defines the light emitting zone of the LED. The LED also includes locking structure, as for example arcuate boss or flange section 17 at the rearward side of panel 11.

The assembly also includes a lens cap 18 receiving the diode, and clip means integral with the cap projecting proximate the LED locking structure. The lens cap projects axially at the front side of the panel, and the diode 12 projects axially forwardly through an opening 19 in the panel 11 and within the cap, also at the front side of the panel. The clip means may with unusual advantage comprise spring fingers 20 projecting rearwardly through opening 19 at the outer side of the diode; further, the spring fingers have tongue and groove interfit with the diode, at the rear side of the panel. The illustrated interfit or releasable interconnection is defined by the reception of the radially projecting boss 17 into first grooves 21 defined by cantilevered extents of the fingers projecting rearwardly of the panel 11. Note that the spring fingers also define second grooves 22 receiving portions 11a of the panel 11 adjacent the circular opening 19.

The fingers 20 further define first cam surfaces 23 located rearwardly of the grooves 21 to be radially spread by the diode boss 17 in response for forward insertion of the diode into the cap. Surfaces 23 are angled rearwardly and radially outwardly, as shown. In addition the fingers define second cam surfaces 24 immediately rearward of the grooves 21 and angled rearwardly and radially inwardly to be radially spread apart by the diode boss 17 in response to relatively rearward retraction of the diode from the cap.

Retention of the diode boss in grooves 21 is assured by a retainer urging the clip means spring fingers into interfitting relation with the diode locking structure, i.e. boss 17. As shown, the retainer may comprise a ring 25 having a circumferentially serrated bore 36 in frictional engagement with the spring fingers, and end 25a engaging panel 11.

It should be noted that four spring fingers 20 may be provided by forming four lengthwise extending slits 26 in the skirt portion of the cap, at 90° intervals about the cap axis. The slits extend forwardly or leftwardly from the rightward end 18a of the cap. The leftward ends 26a of the slits terminate within the bore or opening 19 in the display panel, and to the right of an annular cap shoulder 27 which seats against the face 28 of the panel, and which defines the leftward end of groove 22. The cap is held in that seated position by the frictional grip of the retainer serrations 36 against the spring fingers. In that position, the cap holds the diode itself so that the light zone defined by luminous chip 16 is proximate the plane defined by face 28.

Referring to FIGS. 1 and 2, the lens cap 18 has a flat forwardly or leftwardly presented end 18b. Also, the interior bore of the cap may define axially extending, circumferentially spaced serrations. Similarly, the cap interior front wall may define radially spaced, circular serrations with opposed walls. See U.S. Pat. No. 4,195,330. Such walls refract the light transmitted from the diode through the cap, for providing increased luminosity at local areas of the cap, when viewed from the exterior.

FIGS. 1 and 2 also show that the spring fingers 20 define third cam surfaces 40 rearwardly of the second grooves 22, and angled rearwardly and radially inwardly to be urged radially inwardly by edge portions 41 of the panel in response to rearward installation of the spring fingers through the opening 19; also, the fingers define fourth cam surfaces 42 rearwardly of and adjacent the grooves 22, surfaces 42 being angled rearwardly and radially outwardly to be urged inwardly by edge portions 43 of the panel in response to forward retraction of the fingers through opening 19. Accordingly, the spring fingers accommodate ready installation of the lens cap 18 to a panel, as well as ready removal of the cap from the panel, without the diode being located within the cap; and ready installation of the diode into the installed cap as well as ready removal of the diode from the installed cap.

The lens caps and clip means described herein, and the retainer ring 25 may consist of any suitable plastic material.

In accordance with an important aspect of the invention, a body 125 is integral with retainer ring 25 (or has ring 25 thereon), and the body 125 defines a forwardly opening recess 50 to receive the base of flange section 17 of the light unit (or LED) 12, for retention in that recess, forwardly of recess inner wall 50a. Generally speaking, the body 125 defines multiple cavities having ends located between the recess 50 as well as a rear, outer wall 51 defined by body 125, for reception of the light unit terminals (or terminal means), and for reception of auxiliary terminal means projecting rearwardly of the body.

In the example shown, the multiple cavities include cavities 53–55, of which 53 and 55 intersect walls 50a and 51, and extend in forward and rearward directions. Barrier 64 separates the two cavities 53 and 54 as shown. A circuit element, as for example resistor 56, is located in one of the cavities, i.e. cavity 53, for electrical connection with the light unit terminal means, and also with the auxiliary terminal means. Note body boss 57 received in the relief 158 between the resistor ends 56a and 56b, to position the resistor, endwise.

An electrical connector is provided in at least two of the cavities for engaging the circuit element, and the light unit terminal means. As shown, connector strip 58 in the form of a convoluted spring clip has an end portion 58a projecting sidewardly into the sub-cavity 53a to compressively engage end portion 56a of the resistor. Flat strip 58 has a U-shaped bend 58b in sub-cavity 53a; a U-shaped bend 58c extending over the end of the barrier or partition 64; a straight length 58d along wall 64a of that barrier; a U-shaped bend 58e in cavity 54; and an end portion 58f compressively engaging light unit terminal 13, in cavity 54. The bends of the connector provide the spring force to effect the compressive engagements, as described. See also FIGS. 9 and 10, showing barbs 58g to engage the body and return the connector in place.

The described auxiliary terminal means is shown in the form of a first auxiliary terminal strip 60 received in sub-cavity 53b of cavity 53, and sidewardly and compressively engaging the end portion 56b of the resistor, at 61. See also FIGS. 13 and 14 showing the terminal 60 having barbs 62 and 63 to engage the barrier wall 64b when inserted endwise into recess 53, and having bowed portion 60a to compressively engage the resistor. Thus, the terminal 60 is retained to body 125. Strip 60 projects rearwardly of wall 51.

The resistor may, accordingly, have coding indicia on one or both end faces 56c and 56d thereof, for viewing through the rearwardly open end 53d of cavity 53, depending on which end of the resistor faces rearwardly. Lines 66 illustrate such coding.

Turning to FIGS. 2, 11 and 12, they illustrate the inclusion within the auxiliary terminal means of a second auxiliary terminal 70 engaging the light unit terminal 14 in body cavity 55, and also projecting rearwardly of that body. Terminal 70 comprises an elongated metallic strip having two legs 71 and 72 extending at opposite sides of the light unit terminal 14, the legs being bowed at 71a and 72a to compressively engage terminal 14. A wall abutment 73 projects sidewardly in FIGS. 4 and 7 to engage legs 71 and 72 and prevent rearward withdrawal of the terminal from the recess. Tang 82 on terminal 70 limits its leftward movement.

The two terminals 60 and 70 contain openings 60b and 70b for attachment or connection of wiring, rearwardly of the body 51.

Referring now to FIG. 15, the structure is the same as in FIGS. 1 and 2 and bears the same numbers, excepting that the lens cap 180 is not employed. Instead, an annular grommet 118 extends about the light unit 12 and is integral with the spring fingers 20. The grommet has a shoulder 127 engaging the face 28 of panel 11, and it defines a groove 115 to receive a panel edge portion. Grommet 118 may also consist of plastic material.

FIG. 16 is also like FIGS. 1 and 2 and bears the same numbers, except that an incandescent lamp 112 is employed. FIG. 17 shows a neon lamp 113 usable in place of the LED in FIGS. 1 and 2. Note that it too has terminals 13 and 14. In FIG. 18, showing an assembly as in FIG. 16 employing an incandescent lamp 112, the two like auxiliary terminals 170 (corresponding to terminal 70 in FIG. 2) have arrangement and spacing as shown. In FIG. 19, the arrangement is as in FIG. 1, excepting that the circuit element comprises a jumper connector 140 in place of the resistor, i.e. shunt connector 140 provides a direct electrical connection between connector 58 and terminal 60, the shape of the jumper 140 being the same as that of resistor 56. The jumper may have other shapes.

I claim:

1. For use in a light assembly including a light unit having a base and terminal means projecting rearwardly from the base, the combination with said light unit comprising
    (a) a body and a retainer thereon defining a forwardly opening recess receiving the base of the light unit for retention in the recess,
    (b) the body defining multiple cavities having ends located between said recess and a rear outer wall defined by the body, for reception of said light unit terminal means and for reception of auxiliary terminal means projecting rearwardly of the body, said cavities spaced rearwardly of the light unit base,
    (c) said retainer being intergral with the body and having an annular portion extending about said recess, said annular portion having a serrated bore for retention of clip structure which in turn is coupled to the base of the light unit,
    (d) and including said clip structure which defines spring fingers projecting rearwardly at the side of the light unit, the spring fingers having tongue and groove interfit with the light unit inwardly of the retainer.

2. For use in a light assembly including a light unit having a base and terminal means projecting rearwardly from the base, the combination with said light unit comprising
    (a) a body and a retainer thereon defining a forwardly opening recess receiving the base of the light unit for retention in the recess,
    (b) the body defining multiple cavities having ends located between said recess and a rear outer wall defined by the body, for reception of said light unit terminal means and for reception of auxiliary terminal means projecting rearwardly of the body, said cavities spaced rearwardly of said light unit base,
    (c) said retainer being integral with the body and having an annular portion extending about said recess, said annular portion having a serrated bore for retention of clip structure which in turn is coupled to the base of the light unit,
    (d) and including said clip structure which defines spring fingers projecting rearwardly at the side of the light unit, the spring fingers having tongue and groove interfit with the light unit in said recess inwardly of the retainer, said tongue and groove interfit being defined by a radially projecting annular boss on the light unit, and first grooves defined by the fingers and receiving said boss, the spring fingers defining second grooves to receive portions of a panel, the spring fingers also defining first cam surfaces rearwardly of the first grooves and angled to be radially spread by the light unit boss, in response to forward insertion of the light into the clip structure.

3. The combination of claim 2 wherein said light unit comprises a light emitting diode.

4. The combination of claim 2 wherein said light unit comprises an incandescent lamp.

5. The combination of claim 2 wherein said light unit comprises a neon lamp.

6. The combination of claim 1 including a circuit element in one of said cavities for electrical connection with said light unit terminal means and with said auxiliary terminal means.

7. The combination of claim 6 including an electrical connector in at least two of said cavities for engaging the circuit element and the light unit terminal means.

8. The combination of claim 7 including said circuit element in said one cavity and engaged by the connector, and including said auxiliary terminal means that includes a first auxiliary terminal also engaging the circuit element and projecting rearwardly of the body.

9. The combination of claim 8 wherein said circuit element comprises an electrical resistor having spaced side portions engaged by said connector and by said one auxiliary terminal.

10. The combination of claim 9 including coding indicia on at least one end of the resistor and visible through at least one of said cavity ends aligned with the resistor.

11. The combination of claim 9 including coding indicia on opposite ends of the resistor for viewing through opposite ends of one of the cavities aligned with the resistor.

12. The combination of claim 8 wherein said circuit element comprises a jumper having spaced side portions engaged by said connector and by said one auxiliary terminal.

13. The combination of claim 8 wherein said connector comprises a convoluted spring clip having a first end portion engaging the circuit element in one cavity, a second bend portion extending over a wall defined by said body, and a third end portion engaging the light unit terminal means in another cavity.

14. The combination of claim 8 wherein said auxiliary terminal means includes a second auxiliary terminal engaging the light unit terminal means in a body cavity, and also projecting rearwardly of said body.

15. The combination of claim 14 wherein the light unit terminal means include a first light unit terminal engaging the connector in a body cavity, and second light unit terminal engaging the second auxiliary terminal in another body cavity.

16. The combination of claim 15 wherein the first auxiliary terminal comprises a generally planar elongated metallic strip having a barb interfitting the body to block rearward withdrawal from the body.

17. The combination of claim 15 wherein the second auxiliary terminal comprises an elongated metallic strip having two legs extending at opposite sides of the light unit second terminal.

18. The combination of claim 17 including said light unit having its base received in said recess, and including clip structure retained in said recess by said retainer, the clip structure in turn coupled to the base of the light unit.

19. The combination of claim 18 wherein the light unit comprises an LED.

20. The combination of claim 18 wherein the light unit comprises an incandescent lamp.

21. The combination of claim 18 wherein the light unit comprises a neon lamp.

22. The combination of claim 18 including a lens cap surrounding the light unit and integral with said clip structure.

23. The combination of claim 22 wherein the lens cap defines a groove to receive a panel edge portion.

24. The combination of claim 18 including an annular grommet extending about the light unit and integral with the clip structure.

25. The combination of claim 24 wherein the grommet defines a groove to receive a panel edge portion.

26. The assembly of claim 2 wherein the fingers define second cam surfaces rearwardly of the first grooves and angled to be radially spread by the diode boss in response to rearward retraction of the light unit from the clip structure.

* * * * *